(12) United States Patent
Innocent

(10) Patent No.: US 7,176,732 B2
(45) Date of Patent: Feb. 13, 2007

(54) DEVICE AND METHOD FOR INCREASING THE OPERATING RANGE OF AN ELECTRICAL CIRCUIT

(75) Inventor: Manuel Innocent, Wezemaal (BE)

(73) Assignee: Interuniversitair Microelektronica Centrum (IMEC) vzw), Leuven (BE)

( * ) Notice: Subject to any disclaimer, the term of this patent is extended or adjusted under 35 U.S.C. 154(b) by 119 days.

(21) Appl. No.: 10/930,421

(22) Filed: Aug. 30, 2004

(65) Prior Publication Data

US 2005/0068075 A1 Mar. 31, 2005

Related U.S. Application Data

(60) Provisional application No. 60/499,286, filed on Aug. 28, 2003.

(51) Int. Cl.
*H03L 7/06* (2006.01)
(52) U.S. Cl. .................. 327/157; 327/536; 375/374
(58) Field of Classification Search .............. 327/148, 327/157, 535, 536, 534, 537, 161–163; 331/17, 331/25, DIG. 2; 375/373–376
See application file for complete search history.

(56) References Cited

U.S. PATENT DOCUMENTS

| | | | | |
|---|---|---|---|---|
| 4,961,007 | A * | 10/1990 | Kumanoya et al. ......... | 327/537 |
| 6,094,102 | A * | 7/2000 | Chang et al. ................ | 331/17 |
| 6,157,821 | A | 12/2000 | Boesch et al. ............. | 455/260 |
| 6,329,882 | B1 * | 12/2001 | Fayneh et al. ............... | 331/10 |
| 6,614,275 | B1 * | 9/2003 | Amick et al. ............... | 327/158 |
| 6,687,881 | B2 * | 2/2004 | Gauthier et al. ............. | 716/2 |
| 6,873,670 | B1 * | 3/2005 | Chiu .......................... | 375/375 |
| 2002/0033721 | A1 * | 3/2002 | Tachimori ................... | 327/158 |
| 2002/0163390 | A1 * | 11/2002 | Richardson ................. | 331/17 |
| 2003/0210099 | A1 * | 11/2003 | Ingino ......................... | 331/57 |
| 2004/0012425 | A1 * | 1/2004 | Hsu ............................ | 327/157 |
| 2005/0127981 | A1 * | 6/2005 | Lee et al. ................... | 327/536 |
| 2006/0028255 | A1 * | 2/2006 | Kimura et al. .............. | 327/157 |

FOREIGN PATENT DOCUMENTS

JP 10256903 9/1998

(Continued)

OTHER PUBLICATIONS

Favrat et al., "*A 1.5-V-Supplied CMOS ASIC for the Actuation of an Electrostatic Micromotor*", IEEE/ASME Transactions on Mechatronics, vol. 2, No. 3 (Sep. 1997).

(Continued)

*Primary Examiner*—Linh My Nguyen
*Assistant Examiner*—Thomas J. Hiltunen
(74) *Attorney, Agent, or Firm*—McDonnell Boehnen Hulbert & Berghoff LLP

(57) ABSTRACT

A charge pump circuit and method for supplying power. The charge pump circuit includes a first circuit receiving at least one low voltage signal and generating an output voltage signal. The charge pump circuit also includes a second circuit receiving a clock signal and the output voltage signal. The second circuit sends a request signal based on a comparison of the output voltage signal with two reference voltage signals, where the two reference voltage signals are derived from two supply voltage signals having a substantially constant potential difference. The charge pump circuit further includes a high voltage generator receiving the request signal and sending the two supply voltage signals to the first circuit and the second circuit. The high voltage generator adjusts the voltage potentials of the two supply voltage signals such that the voltage potential of the output voltage signal falls between the voltage potentials of the two reference voltage signals.

14 Claims, 7 Drawing Sheets

U.S. PATENT DOCUMENTS

FOREIGN PATENT DOCUMENTS

WO    WO04/042926    5/2004

OTHER PUBLICATIONS

Nadal-Guardia et al., "*Current Drive Methods to Extend the Range of Travel of Electrostatic Microactuators Beyong the Voltage Pull-In Point*", Journal of Microelectromechanical Systems, vol. 11, No. 3 (Jun. 2002).

Search Report for European Patent Application EP 03 44 7224 of Interuniversitair Microelektronica Centrum vzw, EP 03 44 7224, dated Mar. 31, 2004.

\* cited by examiner

——— LOW VOLTAGE SUPPLY REGION

- - - - - - HIGH VOLTAGE SUPPLY REGION

DEVICE AND METHOD FOR INCREASING THE OPERATING RANGE OF AN ELECTRICAL CIRCUIT

CROSS REFERENCE TO RELATE APPLICATIONS

This application claims priority benefits under 35 U.S.C. § 119(e)(1) to U.S. Provisional Patent Application 60/499,286, filed on Aug. 28, 2003. The entire disclosure of U.S. Provisional Patent Application 60/499,286 is incorporated by reference herein.

BACKGROUND

1. Field

This invention relates to circuits for supplying electrical power and, more specifically, relates to methods and apparatus for providing electrical power so as to increase the operating range of an electrical circuit.

2. Description of Related Art

Tunable Micro Electro-Mechanical Systems (MEMS) devices appear more and more in RF circuits. For example, such devices are frequently implemented in wireless communication systems. Tunable MEMS allow for new functionality, or for improved performance of such systems (e.g. the performance of electrostatically tuned variable capacitors) as compared to previous approaches. The use of tunable MEMS devices provides for improving the linearity of tunable RF filters or enhancing the phase noise behavior of voltage-controlled oscillators. However, the tuning voltage required by such devices is typically between 5V and 50V, which is much higher than the maximum supply voltage of deep sub-micron complementary metal oxide semiconductor (CMOS) technologies in which such MEMS devices may be implemented.

Although the required tuning voltage of tunable MEMS devices may be modified by making design changes, it is extremely difficult to achieve a tuning voltage that is at or below the maximum supply voltage of advanced (deep sub-micron) CMOS technologies. Further, the rapidly decreasing supply voltages of scaled CMOS technologies further complicates this concern. Moreover, there are design/performance trade offs between the tuning voltage and other parameters of MEMS devices (e.g., mechanical resonance frequency, electrical losses and linearity of the device). Given these concerns, it is common to provide (e.g., using a MEMS control circuit) tuning voltages that are higher than the supply voltage of the rest of the system (e.g., the supply voltage of the CMOS components, which may be less than 1.5 V).

One approach that is used is to directly apply a high voltage signal (the tuning voltage) to an output stage of a high voltage control circuit included in a MEMS control circuit. Such approaches may employ a dedicated high voltage device (e.g., Alcatel HBiMOS, available from Alcatel, Paris, France), such as is described in "Current drive methods to extend the range of travel of electrostatic microactuators beyond the voltage pull-in point" by R. Nadal-Guardia. et al. *IEEE J. Microelectromechanical Systems*, Vol.11, No.3, pp.255–263, Jun. 2002. Alternatively, dedicated high voltage devices may be implemented by making process modifications to a standard CMOS manufacturing technology (See e.g., "A 1.5-V-supplied CMOS ASIC for the actuation of an electrostatic micromotor", P. Favrat et al., *IEEE/ASME Trans. on Mechatronics*, Vol.2, No.3, pp. 153–160, September 1997). Such dedicated high voltage devices and/or manufacturing process modifications are typically undesirable due to the cost associated with such approaches.

SUMMARY

Embodiments of the present invention may be employed to generate a tuning voltage (and to supply an associated current) at a voltage higher than a supply voltage (e.g., the supply voltage of a deep sub-micron CMOS technology). In one embodiment, such a circuit (which may be termed a "charge pump circuit") comprises a first circuit, a second circuit and a high voltage generator. The first circuit, in operation, receives at least one low voltage signal at an input terminal and provides an output voltage signal corresponding to the at least one low voltage signal. The second circuit, in operation, receives a clock signal and the output voltage signal from the first circuit. The second circuit also sends a request signal to the high voltage generator when the output voltage signal does not match reference voltages signals. The high voltage generator, in response to the request signal, sends two supply voltage signals (on which the reference voltage signals are based) to the first circuit and the second circuit. The two supply voltage signals have a substantially constant voltage difference. Further, the high voltage generator, in operation, adjusts the potential of the two supply voltage signals, until the voltage potential of the output voltage signal is between two reference voltage signals that are derived from the supply voltage signals.

In one embodiment, the first circuit and the second circuit operate in a high voltage power supply region, while the high voltage generator operates in a low voltage power supply region. In this situation, level converters may be used to provide the transition for signals between the high voltage and the low voltage power supply regions. Such level converters may be implemented using a coupling capacitor, though other implementations are possible. In such an embodiment, the second circuit may comprise a comparator that compares a voltage signal derived from the output voltage signal (of the first circuit) with the reference voltage signals derived from the two supply voltage signals (from the high voltage generator). The comparator may be implemented as a sense-amplifier latch. Depending on the particular embodiment, the second circuit may further comprise an operational transconductance amplifier.

In certain embodiments, the high voltage generator comprises a number of substantially identical stages, where the last of these stages, in operation, is substantially continuously clocked. For this embodiment, each of the stages comprises two cells that are coupled in parallel, where one cell is employed to pump charge up and the other is employed to pump charge down. Circuits such as those described above may be included in a Phase-Locked Loop with a MEMS variable capacitor or in a MEMS switch. Such approaches provide for implementing a "power on demand" power supply that is able to adjust its voltage potential both up and down that may be implemented in a standard triple-well CMOS technology.

A method for increasing the operating range of an electrical circuit that may be implemented using a charge pump circuit, such as described above, where the method comprises applying at least one low voltage signal to a first circuit, where the first circuit produces an output voltage signal based on the at least one low voltage signal. The method, further includes applying a clock signal to a second circuit and communicating the output voltage signal to the second circuit. The method still further includes comparing the output voltage signal with two reference voltage signals.

In the method, if the potential of the output voltage signal does not fall between the potentials of the reference voltage signals, the second circuit sends a request signal to a high-voltage generator (operating in a low voltage power supply region). In response to the request signal, the high voltage generator sends two supply voltage signals to the first circuit and the second circuit, where the two supply voltage signals have a substantially constant voltage difference. Still further, the method includes adjusting the two supply voltage signals such that the potential of the output voltage signal falls between the respective potentials of the two reference voltage signals. Such a method implements "power on demand" functionality, as described above.

These and other aspects will become apparent to those of ordinary skill in the art by reading the following detailed description, with reference, where appropriate, to the accompanying drawings. Further, it should be understood that the embodiments noted in this summary are not intended to limit the scope of the invention as claimed.

BRIEF DESCRIPTION OF THE DRAWINGS

Exemplary embodiments of the present invention are described herein with reference to the drawings, in which.

DETAILED DESCRIPTION

While embodiments of charge pump circuits are described generally with respect to a charge pump circuit for use with a MEMS variable capacitor, it will be appreciated that such circuits may be employed in other applications. However, in one embodiment, a control circuit portion of a charge pump circuit dynamically adjusts a power supply voltage (e.g., a tuning voltage) while only applying a limited voltage to an output stage of a high voltage control circuit. The circuit is implemented in a triple well technology, which is becoming increasingly more prevalent in CMOS processes with analog circuit options. The circuit does not employ any additional high voltage technology (e.g., processing steps) or devices. In such a circuit, the output voltage produced is limited by the N-well to substrate breakdown voltage of the particular manufacturing technology with which the charge pump is implemented. Such charge pump circuits may be used to implement a 'power on demand' power supply. The output voltage produced by the charge pump may then be employed for use in a phase-locked-loop circuit (PLL) with a MEMS variable capacitor.

Overview of High Voltage Charge Pump

Figure 1:
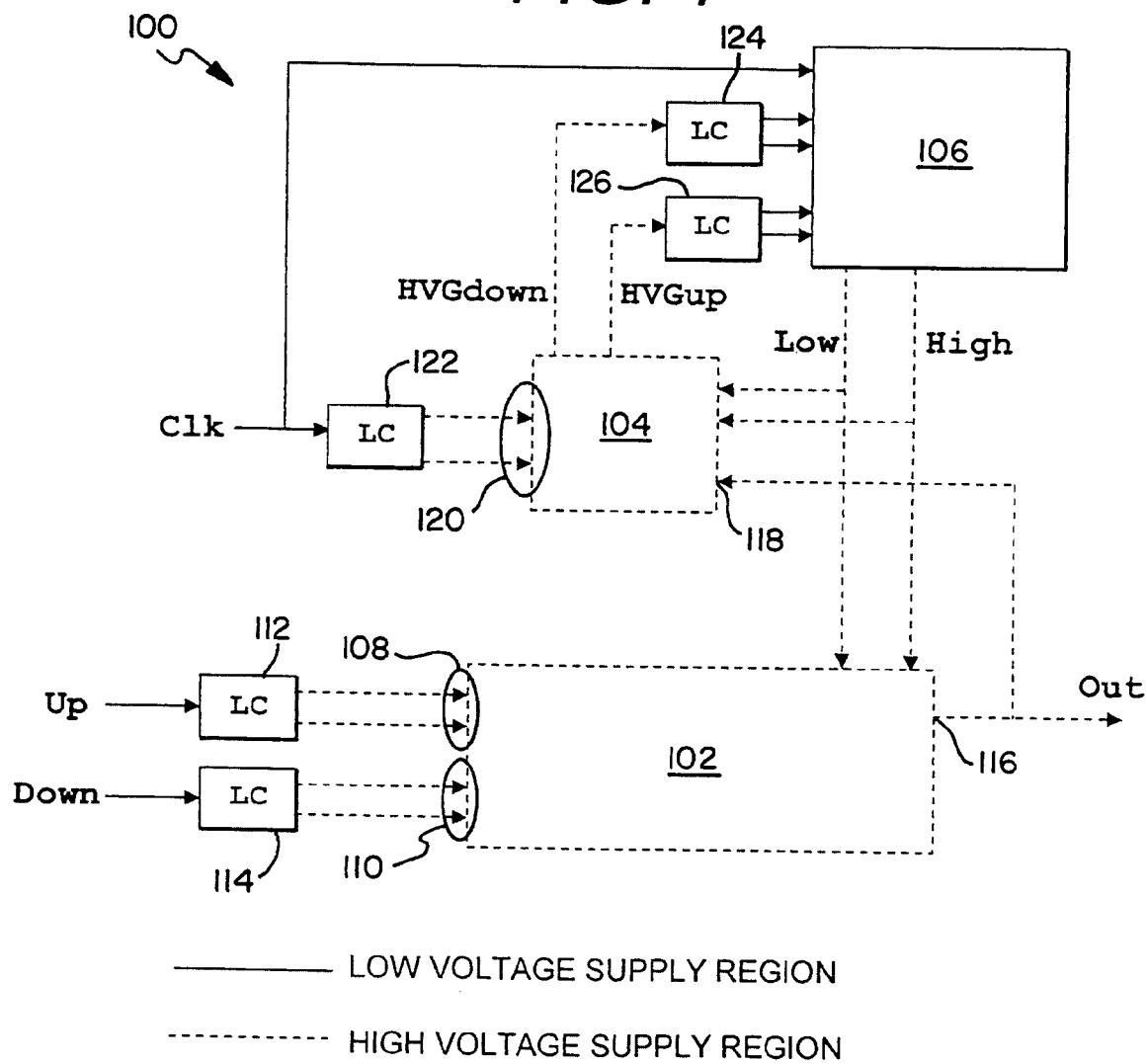
FIG. 1 is block diagram illustrating a high voltage charge pump for supplying a voltage potential above its supply voltage potential.

Referring now to FIG. 1, a block diagram illustrating an embodiment of a high voltage charge pump circuit 100 that implements power on demand functionality is shown.

The circuit 100 includes a control portion and a high voltage generation portion. The control portion includes a first circuit 102 and a second circuit 104, which are described in further detail below with respect to FIG. 2. The first circuit 102 and the second circuit 104 both operate in a high voltage power supply region. The circuit 100 further includes a high voltage generator 106 that operates in a low voltage power supply region. The first circuit 102 receives two low voltage signals (designated Up and Down) at its input terminals 108 and 110. The Up and Down signals are converted from low voltage power supply region signals to high voltage power supply region signals using, respectively, level converters 112 and 114. The first circuit 102 provides an output voltage signal (designated Out) via an output terminal 116.

The second circuit 104 receives the output voltage signal via an input terminal 118. The second circuit 104 also receives a clock signal (designated Clk) at input terminals 120 via a level converter 122. The level converter 122, in like fashion as the level converters 112 and 114, converts the clock signal from a low voltage power supply region signal to a high voltage power supply region signal. The second circuit 104 is further coupled with the high voltage generator 106 via level converters 124 and 126. In contrast to the level converters 112, 114 and 122, the level converters 124 and 126 convert request signals (designated HVGdown and HVGup) communicated from the second circuit 104 to the high voltage generator 106 from high voltage power supply region signals to low voltage power supply region signals. The request signals indicate whether an increase (HVGup) or a decrease (HVGdown) in two supply voltage signals (designated High and Low) produced by the high voltage generator 106 is desired. Such requests are discussed in further detail below.

The charge pump circuit 100 of FIG. 1 may be employed as the charge pump of a PLL. Because the circuit 100 has substantially the same external connections (e.g., up and down signals) as a standard charge pump, it may be readily implemented in PLLs (or other circuit employing charges pumps, such as back bias generators) in place of previous charge pump circuits. The charge pump circuit 100, however, has a much larger output voltage range as compared to previous approaches due, at least in part, to its power on demand functionality.

The circuit 100 includes two major blocks (i) the charge pump control portion (including the first circuit 102 and the second circuit 104) in the high voltage power supply region and (ii) the high-voltage generator 106 in the low voltage power supply region. Power is supplied to the circuit 100 using an external ground and Vcc supply (e.g., 1.8V for current CMOS technologies). As was discussed above, signals in the circuit 100 go from one region to another (e.g., from the high voltage power supply region to the low voltage power supply region) through level converters, such as the level converters 112, 114, 122, 124 and 126. The level converters may further comprise circuit components for buffering the signals. For this particular embodiment, the level converters may be implemented using a coupling capacitor, though other level conversion techniques are possible. Thus, for the circuit 100, a closed control loop is formed between the low voltage power supply region and the high voltage power supply region.

This closed control loop operates to keep the potential of the output voltage signal substantially centered between the potential of the power supply signals (High and Low) that are generated by the high voltage generator 106. The power supply signals (High and Low) are adjusted in response to the request signals (HVGdown and HVGup) generated by the second circuit 104. While both supply voltage signals produced by the high voltage generator 106 are adjusted in response to an up request (indicated by HVGup) or a down request (indicated by HVGdown), the voltage potential difference between the supply voltage signals (Low and High) remains substantially constant at, e.g., approximately the nominal power supply voltage for the particular technology in which the circuit 100 is implemented. The constant difference between the two supply voltage signals results in the charge pump circuit 100 behaving in a highly linear fashion over a large voltage range.

Control Circuit of Charge Pump

Figure 2:
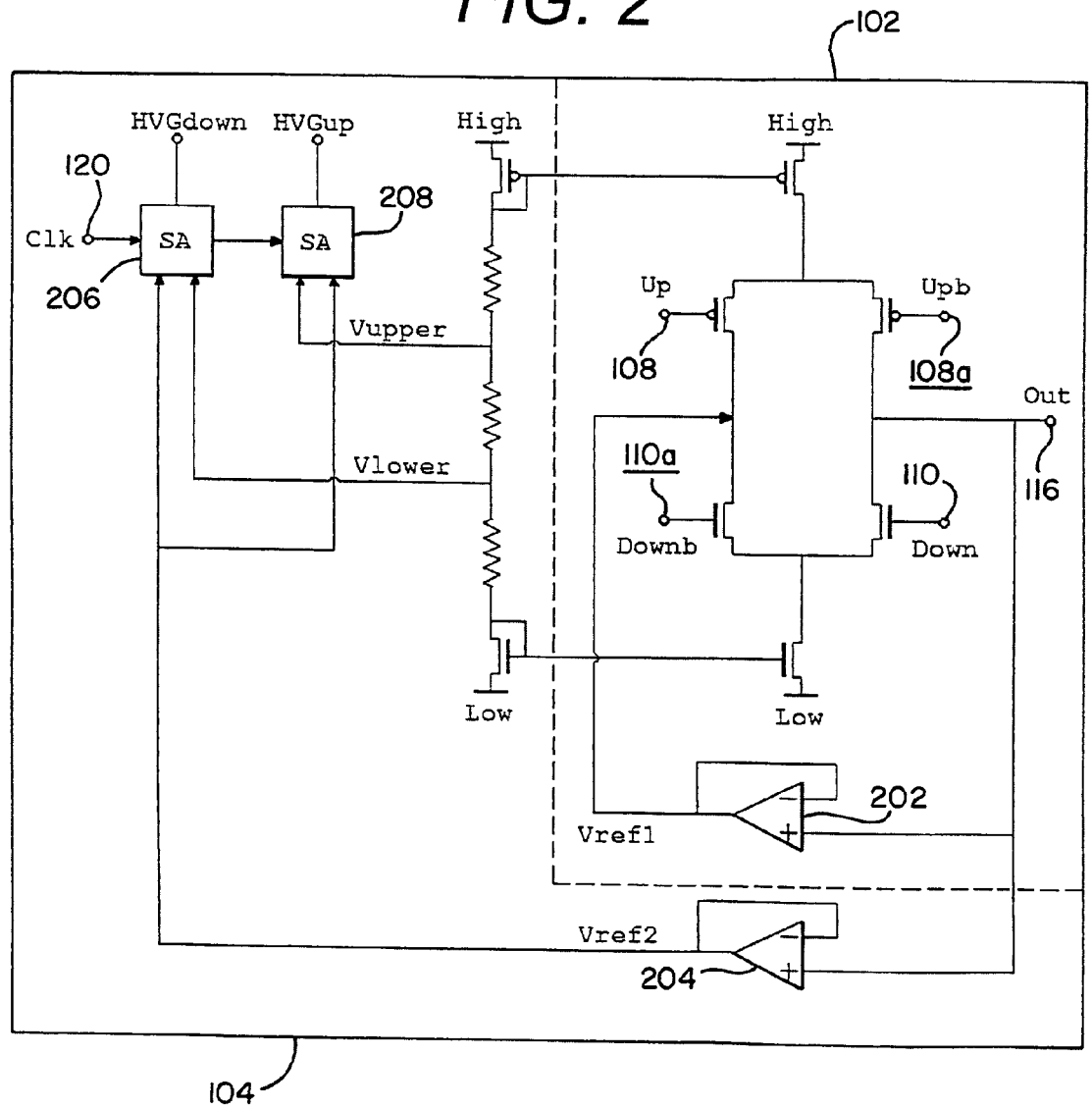
FIG. 2 is a schematic diagram illustrating a control circuit portion of the charge pump of FIG. 1 in further detail.

Referring now to FIG. 2, a schematic diagram is shown that illustrates the control portion of the circuit 100 (including the first circuit 102 and the second circuit 104) in more detail. The output voltage signal of the charge pump circuit 100, which is communicated via the terminal 116, is the voltage potential to which the other voltages of the circuit 100 are adjusted. The output voltage signal is buffered with two substantially symmetrical operational transconductance amplifiers 202 and 204 to produce two respective substantially equal voltage reference signals (designated $V_{ref1}$ and $V_{ref2}$). Vref2 is then compared to two reference voltages (designated $V_{upper}$ and $V_{lower}$) with sense amplifier latches 206 and 208. For the circuit shown in FIG. 2, the references $V_{upper}$ and $V_{lower}$ are at approximately 60% and 40% between the High and the Low supply voltage signals. If the potential of the output voltage signal is outside the range defined by $V_{upper}$ and $V_{lower}$, an appropriate request signal (HVGdown or HVGup) is communicated by the second circuit 104 to the high voltage generator 106 (as shown in FIG. 1) to indicate an adjustment to the supply voltage signals (High and Low) is desired.

For example, if the potential of the output voltage signal falls below the lower reference voltage $V_{lower}$, a request signal (HVGdown) is sent by the sense amp 206 to the high voltage generator 106. As a result of this request signal, the potential of the supply voltage signals (High and Low) generated by the high voltage generator are decreased (maintaining a substantially constant difference between them) until the lower reference voltage $V_{lower}$ drops below the potential of output voltage signal. Thus, if the potential of the output voltage signal is outside the range of the upper and lower reference voltages ($V_{upper}$ and $V_{lower}$), it is not corrected by directly adjusting the output voltage signal, but by adjusting the power supply signals generated by the high voltage generator 106.

By way of example, if the charge pump circuit 100 is employed in a PLL, the Up and Down signals may be supplied using a phase frequency detector of the PLL. These signals may be converted using level converters (such as level converters 112 and 114 in FIG. 1). The level converters produce a level converted version of the Up and Down signals from low voltage power supply region signals to high voltage power supply region signals. Additionally, the level converters produce an inverse version of the converter Up and Down signals, Upb and Downb, respectively, which are communicated to the charge pump circuit via terminals 108a and 110a, respectively.

High Voltage Generator

Figure 3:
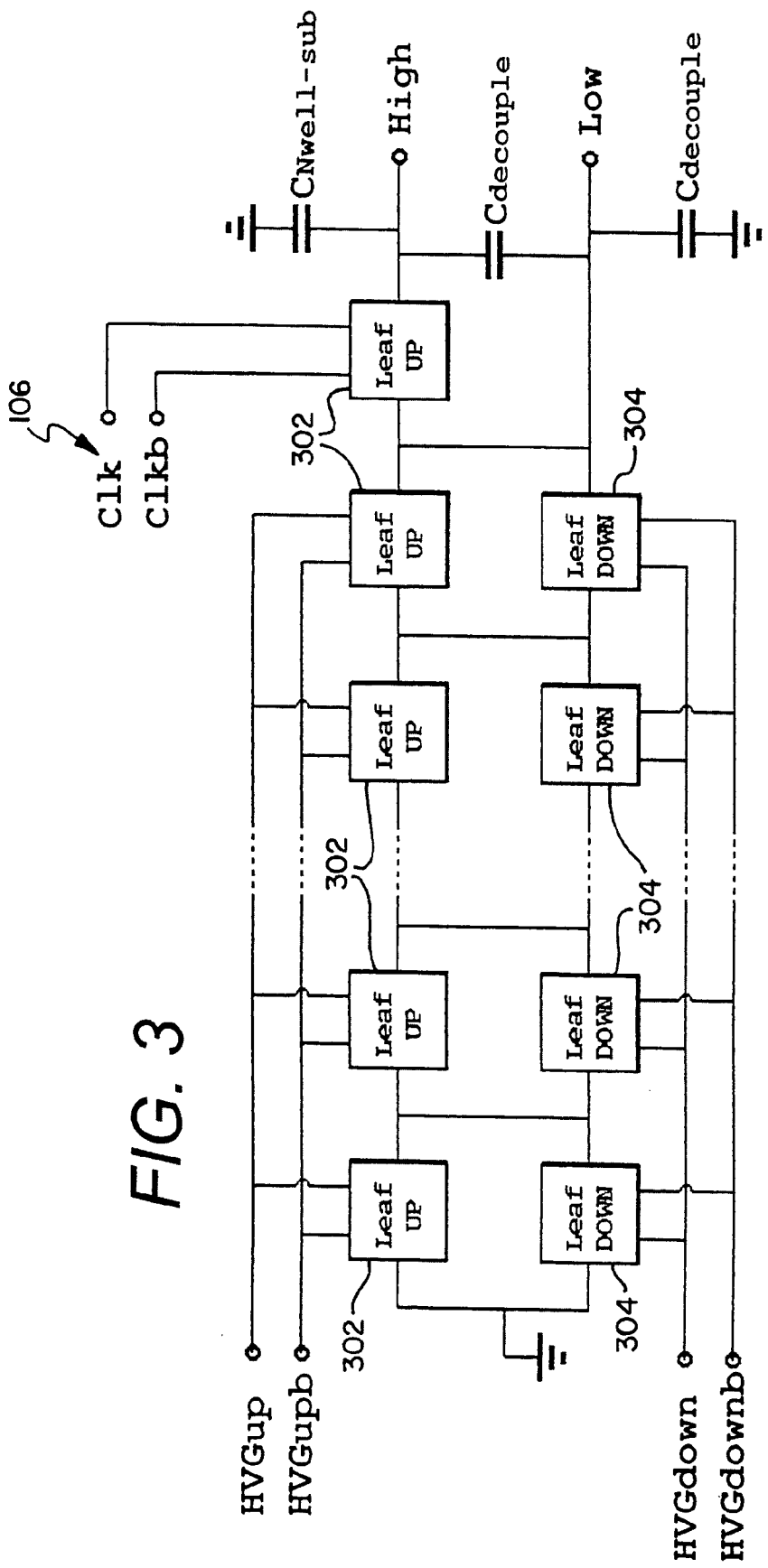
FIG. 3 is a block/schematic diagram illustrating the high voltage generator of FIG. 1 in further detail.

Referring now to FIG. 3, the high voltage generator 106 of the charge pump circuit 200 is shown in more detail. The high voltage generator 106 provides the supply voltage signals High and Low for the charge pump circuit 100. The high voltage generator consists of a number of substantially identical stages that can pump charge either up or down. Each of these stages includes a Leaf UP 302 and a Leaf DOWN 304. The last stage of the high voltage generator 106 includes only a Leaf UP 302 and, in operation, is substantially continuously clocked to generate the supply voltage signals (High and Low) for the high voltage region of the charge pump circuit 100 (as shown in FIG. 2).

The number of stages of the high voltage generator 106 is determined by the required output voltage range of the charge pump circuit 100 and is limited by the characteristics of the n-well to substrate junction breakdown voltage for the particular technology with which the circuit is implemented. The high voltage generator 106 shown in FIG. 3, in operation, is able to generate voltages that are much higher than its own supply voltage (e.g., typically 1.8V for 0.18 μm CMOS technologies). Previous approaches implemented high voltage generators such as the one described in "On-chip high-voltage generation in MNOS integrated circuits using an improved voltage multiplier technique", J. F. Dickson, *IEEE J. Solid-State Circuits*, Vol.11, No.3, pp. 374–378, June 1976. Dickson's high voltage generator, however, can only pump charge to higher voltages (pump charge up). It is not capable of lowering its supply voltage again.

By employing the high voltage generator 106 (in combination with the control circuit shown in FIG. 2), a "power on demand" power supply (charge pump circuit 100) may be implemented. The charge pump circuit 100 provides for both increasing and decreasing the supply voltage signal(s) provided (e.g., High and Low).

Figure 4:
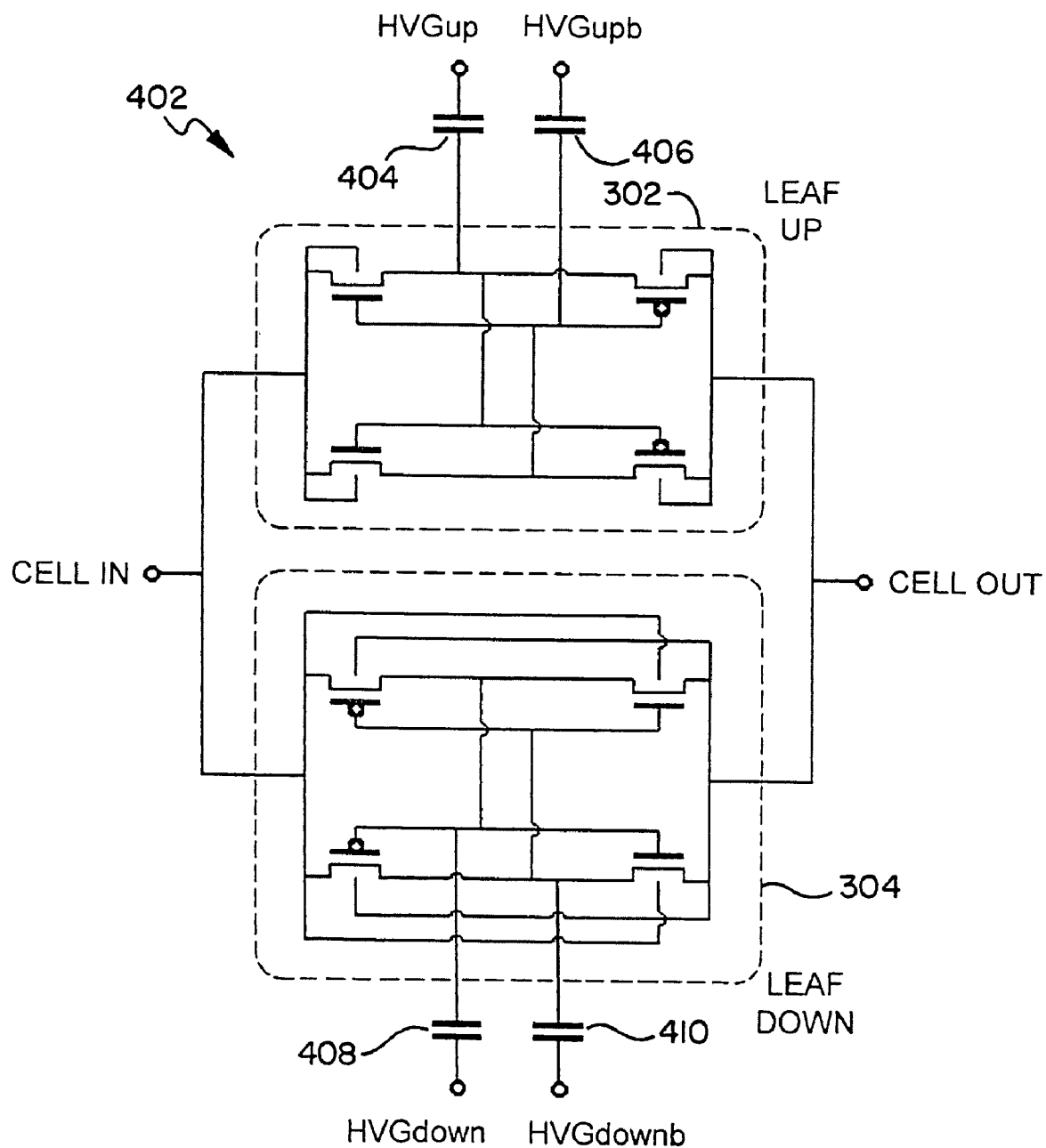
FIG. 4 is a schematic diagram that illustrates a single stage of the high voltage generator of FIG. 3.

Referring now to FIG. 4, a single stage 402 of the high voltage generator 106 is shown. The stage 402 includes one Leaf UP cell 302 and one Leaf DOWN cell 304. For this particular embodiment, the Leaf UP cell 302 and the Leaf DOWN cell 304 are implemented using a cell such as the one described by R. Pelliconi et al. in 'Power efficient charge pump in deep submicron standard CMOS technology', Proc. 27 ESSCIRC.2001, pp.100–103. The cell is connected in one direction for the Leaf UP cell 302 (for pumping charge up) and in the reverse for the Leaf DOWN cell 304 (for pumping charge down). It is noted that each stage of the high voltage generator 106 is located in a separate N-well, where the N-wells are charged to the respective output voltages of their stage. The input voltage signal for the stage 402 is communicated to the stage 402 via a terminal 404 (designated CellIn). The output voltage signal is communicated (e.g., to the next stage) via a terminal 406 (designated CellOut).

Each of the cells 302 and 304 of the stage 402 are coupled with two capacitors (capacitors 404 and 406 for the Leaf UP cell 302 and capacitors 408 and 410 for the Leaf DOWN cell 304). The cells 302 and 304 are implemented with standard low voltage transistors of the particular technology used to implement the charge pump circuit. In operation, the voltages across these transistors are approximately equivalent to the nominal supply voltage associated with the particular manufacturing technology. The final stage (right-most stage in FIG. 3) of the high voltage generator 106 is substantially continuously clocked by two complementary clock signals.

This two-phase clocking scheme provides for employing a relatively high clock frequency (>50 MHz) for pumping charge.

As may also be seen in FIG. 3, all of the stages of the high voltage generator 106 (e.g., the stage 402), except the last stage, are conditionally clocked with the HVGup and HVGdown signals (which are the request signals coming from the second circuit 104 of the charge pump circuit 100's control portion. The last stage is substantially continuously clocked (using the complementary clock signals Clk and Clkb as discussed above) to generate the power supply voltage signals (High and Low) for the high voltage power supply region.

The voltage gain ΔV over each stage has two contributions, as shown by:

$$\Delta V = V_{dd} \frac{C}{C + C_{par}} - R_{out} I_{out}, \quad \text{(Formula 1)}$$

in which the output resistance $R_{out}$ is:

$$R_{out} = \frac{1}{frequency C} + R_{switch}. \quad \text{(Formula 2)}$$

In the first term of Formula 1, the capacitance C is the coupling capacitance in the control lines (HVGup, HVGupb) and $C_{par}$ is the parasitic capacitance of the internal nodes of the basic cell, not of the input and output nodes. Hence, the presence of the Leaf DOWN cell 304 does not limit the voltage gain of the Leaf UP cell 302. However, the transistors of the Leaf UP cell 302 form a large part of the parasitic capacitance. This capacitance may be reduced by make the transistors of the cells 304 and 304 small. $V_{dd}$ denotes the supply voltage, e.g. 1.8V.

The second term of Formula 1 depends on the output current. Therefore, a differentiation between the final stage that generates the supply voltage signals (High and Low) for the high voltage power supply region and the "intermediate" stages (two cell stages) that change the absolute voltage should be made. $R_{switch}$ denotes the resistance of the transistors when conducting.

The final stage, in operation, substantially constantly supplies a current to the circuits in the high voltage power supply region. Thus, the value of $R_{out}$ (Formula 2) should be small enough to limit the amount of voltage loss in this stage. This may be achieved by using transistors with a small on-resistance and a large capacitor (404, 406, 408 and 410) and/or a high clock frequency.

For the other stages, the considerations are different. If the charge pump circuit 100 is used to control an electrostatically tuned varicap, then the main concerns are delivering the charge/discharge current of the varicap and of the high voltage power supply region. Typically, there is negligible static current flowing. Therefore, the peak voltage is defined by the capacitance ratio.

Empirical and Simulation Results

Empirical measurements were made on a charge pump circuit in accordance with the circuits illustrated in FIGS. 1–4. The circuit was processed using a 0.18 μm CMOS technology with a pad-limited die size of 700 μm*700 μm. However, the area of the circuit was only 300 μm*430 μm.

The following discussion illustrates the large output voltage range of the charge pump circuit and that such circuits provide a low power solution that is scalable to future CMOS technology generations.

The measurements were made with a load capacitance $C_{load}$ of 22 pF on the output voltage terminal 116 of charge pump circuit and measured with an oscilloscope connected to the Low power supply signal line of the high voltage power supply region because the input resistance of the oscilloscope probe was 1 MΩ, which was too low to connect directly with the output voltage terminal 116. The table below summarizes the measurement conditions.

| | |
|---|---|
| Supply | 1.8 V |
| Number of stages | 10 + 1 |
| Load | 22 pF |
| Clock frequency | 50 MHz |
| Up and Down signals | |
| Frequency | 100 kHz |
| Duty cycle | 20% |

Figure 5:
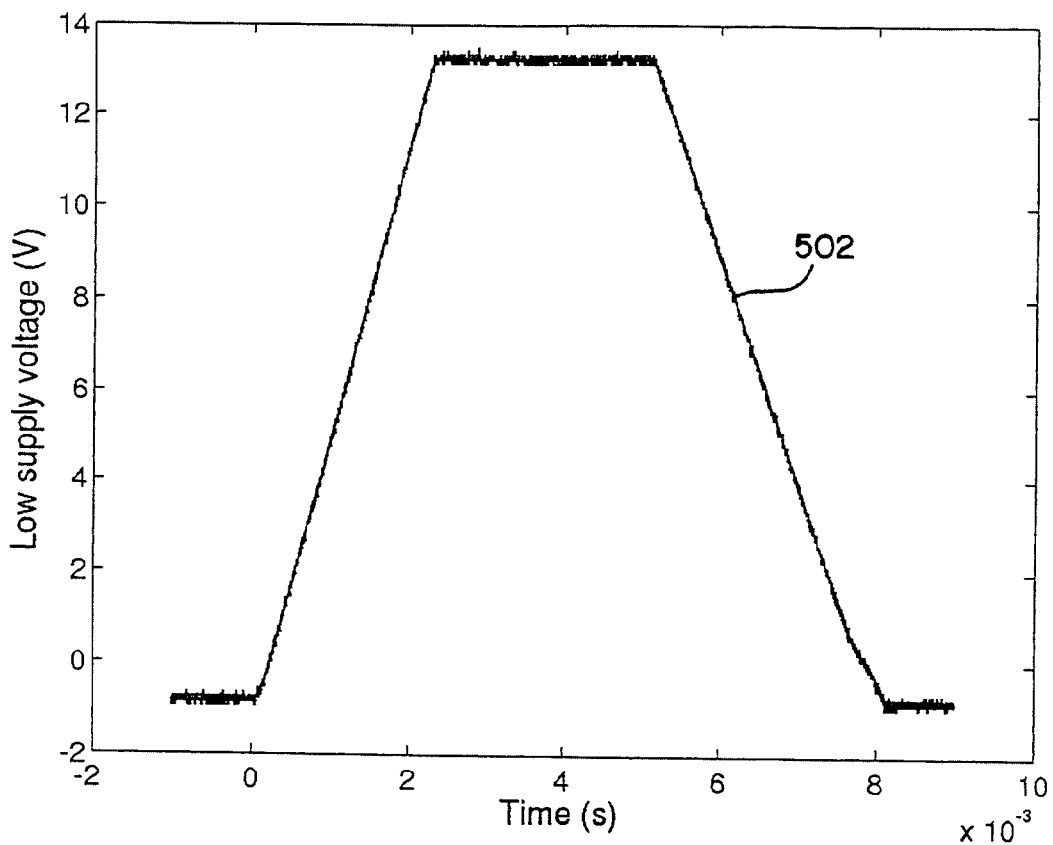
FIG. 5 is a graph illustrating a transient voltage measurement of the Low supply signal of the high voltage power supply region for the circuit of FIG. 1.

FIG. 5 shows a transient measurement 502 of the Low power supply signal of the high voltage power supply region. From the transient measurement, the charge pump output current can be calculated:

$$I_{out} = \frac{C_{load}}{DutyCycle} \frac{\Delta V}{\Delta t}, \quad \text{(formula 3)}$$

As may be seen from Formula 3, the charge pump circuit is highly linear and the output current is substantially constant over the complete voltage range. The current consumption depends strongly on the operating environment. A peak current of 1 mA is drawn when the output is limited by conduction or breakdown of the N-well to substrate junction. In normal operation this is also the peak current that occurs as a result of transients. In steady state, with a 50 MHz clock signal, but without any request signals (HVGup or HVGdown), the current consumption was only around 85 μA and the leakage current was so small that no significant difference in output voltage was measured after 1 second. When the charge pump circuit is employed in a locked PLL, the request signals (HVGup and HVGdown from the phase detector) are very small. Thus, the current consumption in such an embodiment will be very close to the steady state measured value of 85 μA. Therefore, the charge pump circuit 100 may be regarded as a low power solution. Furthermore, when the clock signal was off (e.g., in standby mode) the supply current dropped to only a few nA.

The high voltage generator of the tested circuit had 10 (two cell "intermediate") +1 (final) stages and powered with a supply voltage potential of 1.8V. Thus, the theoretical peak output voltage (without considering parasitic capacitances) was 19.8V. However, the measurement showed 13.2V at the Low power supply signal node, plus an additional 1.6V increase over the final stage, for a total voltage of 14.8V. This difference (between 19.8V and 14.8V) is larger than would be expected based on the parasitic capacitance of the circuit. The difference is, however, explained by the characteristics of the N-well to substrate junction.

Figure 6:
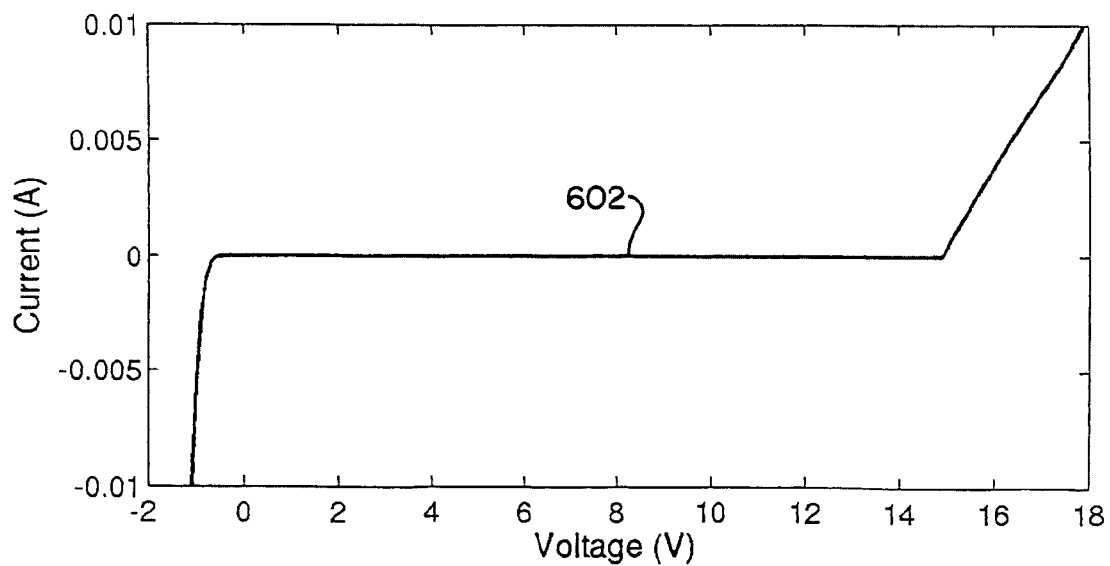
FIG. 6 is graph illustrating the measured current through an N-well to substrate junction as a function of the bias voltage for 0.18 μm CMOS.

The high voltage power supply region is located inside an N-well, which is charged to the potential of the High power supply signal. The theoretical peak voltage in the system is the breakdown voltage of the N-well to substrate junction, which is 14.8V for the CMOS technology used. This is illustrated in FIG. 6 by the current graph (with a trace 602) for the studied charge pump circuit. Thus, the output voltage signal potential is limited because attempting to charge the well to a higher voltage (than 14.8V) results in charge flowing away to the substrate due to junction breakdown. As the breakdown voltage poses a fundamental limit on the output voltage, it was examined for several technologies. The results were all in approximately the same range, e.g., 16.2V for a 0.35 µm BiCMOS technology and 17.5V and 18.5V volts for two versions of a 0.09 µm CMOS technology. This study shows that such charge pump circuits may be used in future technologies. Table 2 summarizes the measurement results.

| | |
|---|---|
| Output current | 0.7 µA |
| Supply current max | 1.0 mA |
| Supply current idle (50 MHz clock) | 85 µA |
| Supply current leakage (no clock) | 2.5 nA |
| Voltage range (at "Low" node) | −0.7 . . . +13.2 V |
| Voltage range (at output) | −0.7 . . . +14.8 V |

Figure 7:
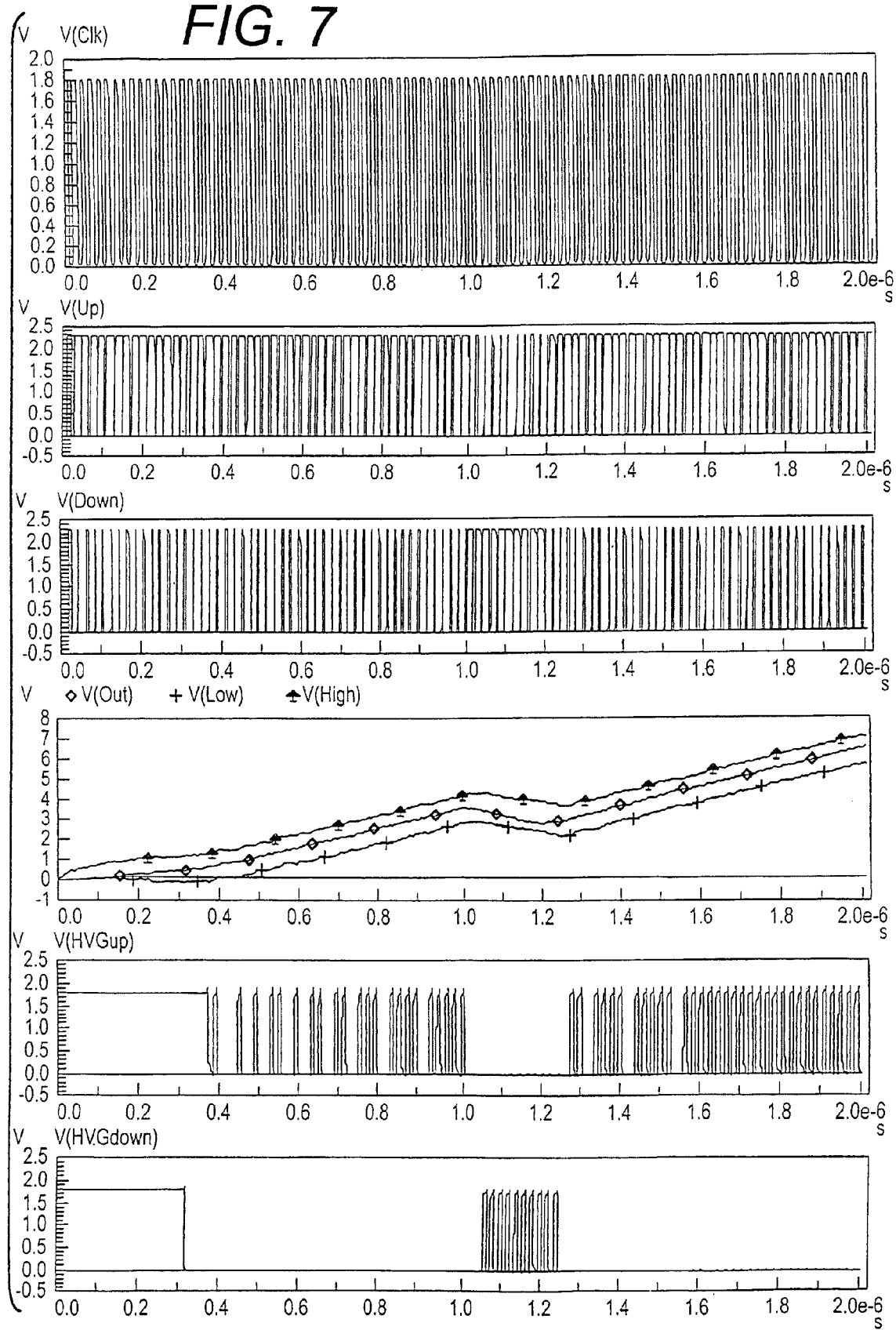
FIG. 7 is timing diagrams illustrating simulation results for the circuit of FIG. 1.

Some simulation results are shown by the timing diagrams presented in FIG. 7. The upper three diagrams show the input signals to the charge pump circuit. Specifically, in the first diagram, V(Clk) represents the clock signal, which is a 50 MHz square wave with 50% duty cycle. In the second diagram, V(Up) represents the Up signal, which is a pulse width modulated signal. The wider the Up pulses, the longer the output current will flow towards the load (e.g., a MEMS capacitor). In this simulation the Up pulses are wide, except for the time between 1.0us and 1.2us. In the third diagram, V(Down) represents the Down signal, which is a pulse width modulated signal. The wider the Down pulses, the longer the current will flow from the load into the output. In this simulation the Down pulses are narrow, except for the time between 1.0us and 1.2us. For the Up and Down pulses illustrated in FIG. 7, current will flow to the load from the charge pump circuit, except for the time between 1.0us and 1.2us, when the current will flow from the load into the output voltage signal terminal.

The lower three timing diagrams in FIG. 7 illustrate internal signals and the output signal. Specifically, in the fourth diagram, V(Out) represents the output voltage, i.e. the voltage over the load on the output voltage signal terminal 116. V(Low) represents the Low power supply signal of the high voltage power supply region. V(High) represents the High power supply signal of the high voltage power supply region. In the fifth diagram, V(HVGup) represents the request signal to the high voltage generator 106 to increase both supply voltages of the high voltage power supply region. In the sixth diagram, V(HVGdown) represents the request signal to the high voltage generator 106 to decrease both supply voltage signals (Low and High) of the high voltage power supply region.

After the startup transients are finished, the difference between V(Low) and V(High) is substantially constantly at 1.8V. The HVGup signal gets a pulse whenever V(Out) approaches too close to V(High), similarly the HVGdown signal gets a pulse whenever V(Out) approaches too close to V(Low). V(High) and V(Low) are adjusted such that the output voltage signal potential stays approximately centered between them.

Current Source Employing Charge Pump

Figure 8:
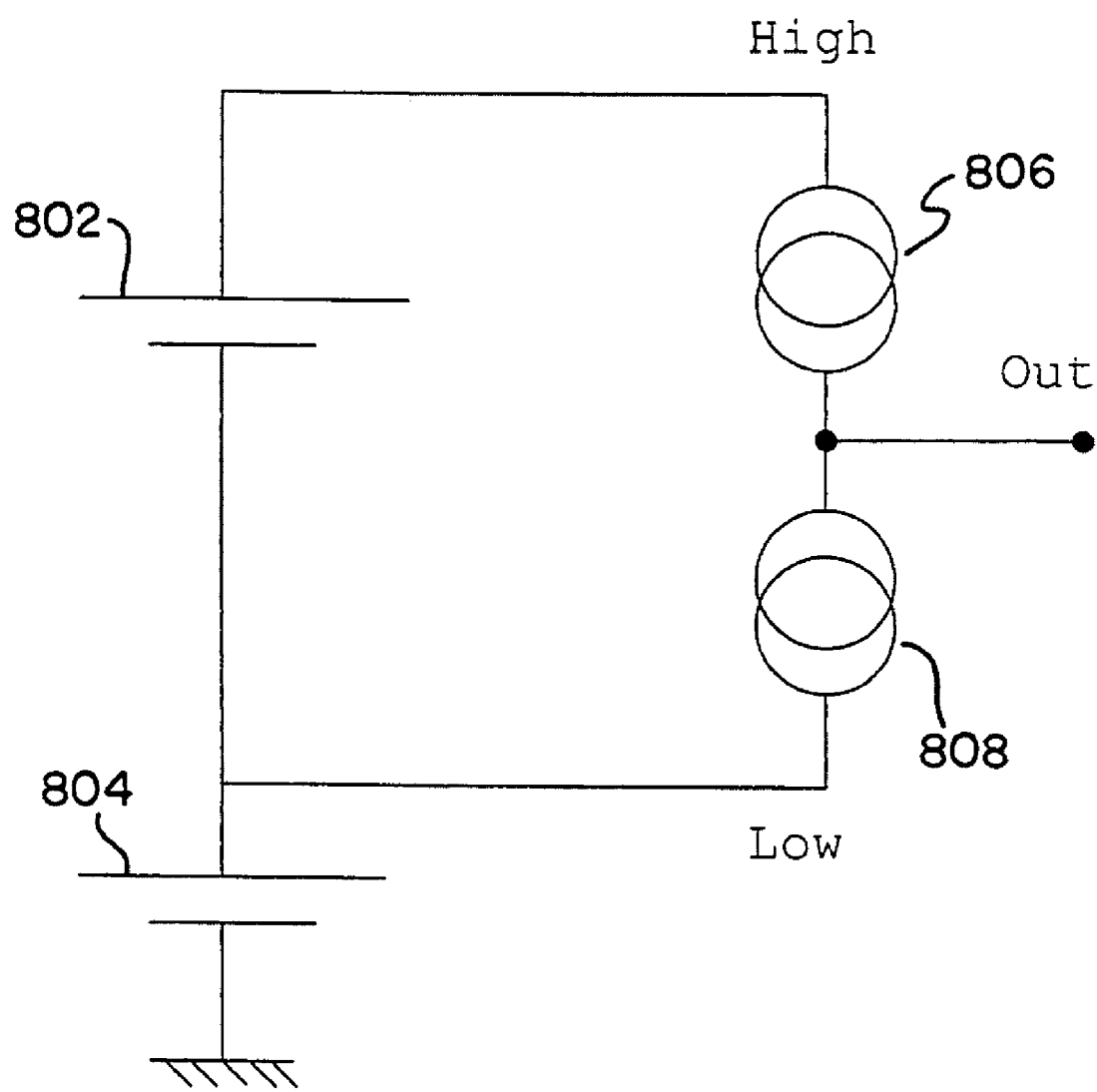
FIG. 8 is a schematic diagram showing a circuit in accordance with an embodiment of the invention implemented as a current source.

Referring now to FIG. 1, a schematic diagram is shown that illustrates a circuit 800 in which a charge pump circuit (such as the charge pump circuit 100) is employed as a current source. The voltage sources 802 and 804 in the circuit 800 correspond to the high voltage generator. The voltage source 802 corresponds to the last stage of the high voltage generator 106 shown in FIG. 3. The voltage source 804 corresponds to the 10 identical stages (of Leaf UP cells 302 and Leaf DOWN cells 304) of FIG. 3, as described above. The first circuit 102 is represented by the two current sources 806 and 808. The voltage source 804 is regulated such that the output voltage is between the voltages on the two sides of the voltage source 802. The feedback circuit that performs this regulation (e.g., such as the second circuit 104 of FIGS. 1 and 2) is not shown in FIG. 8.

Conclusion

Various arrangements and embodiments in accordance with the present invention have been described herein. It will be appreciated, however, that those skilled in the art will understand that changes and modifications may be made to these arrangements and embodiments without departing from the true scope and spirit of the present invention, which is defined by the following claims.

What is claimed is:

1. A charge pump circuit comprising:
    a first circuit receiving at least one low voltage signal and generating an output voltage signal;
    a second circuit receiving a clock signal and the output voltage signal, wherein the second circuit sends a request signal based on a comparison of the output voltage signal with two reference voltage signals, the two reference voltage signals being derived from two supply voltage signals, wherein the second circuit comprises a comparator for comparing a voltage signal derived from the output voltage signal with the reference voltage signals derived from the supply voltage signals; and
    a high voltage generator receiving the request signal and sending the two supply voltage signals to the first circuit and the second circuit, wherein the two supply voltage signals have a substantially constant difference in voltage potential and the high voltage generator adjusts the voltage potentials of the two supply voltage signals such that the voltage potential of the output voltage signal falls between the voltage potentials of the two reference voltage signals.

2. The charge pump circuit of claim 1, wherein the first circuit and the second circuit operate in a high voltage power supply region of the charge pump circuit and the high voltage generator operates in a low voltage power supply region.

3. The charge pump circuit of claim 2, further comprising one or more level converters to convert a signal level of the at least one low voltage signal and the clock signal from the low voltage power supply region to the high voltage power supply region and to convert a signal level of the request signal from the high voltage power supply region to the low voltage power supply region.

4. The charge pump circuit of claim 1, wherein the comparator comprises a sense amplifier latch.

5. The charge pump circuit of claim 1, wherein the second circuit further comprises an operational transconductance amplifier generating the voltage signal derived from the output voltage signal.

6. The charge pump circuit of claim 1, wherein the charge pump circuit is employed in a phase locked loop circuit.

7. The charge pump circuit of claim 1, wherein the first circuit further comprises an operational amplifier for generating a voltage signal from the output voltage signal for comparison to the reference voltage signals.

8. The charge pump circuit of claim 1, wherein the high voltage generator comprises:
   a plurality of substantially identical intermediate stages; and
   a final stage, wherein, in operation, the intermediate stages are conditionally clocked by the request signal and the final stage is substantially continuously clocked by a clock signal.

9. The charge pump circuit of claim 8, wherein each of the plurality of intermediate stages consists of two cells connected in parallel, wherein one cell is coupled so as to pump charge up and the other cell is coupled so as to pump charge down.

10. A Phase-Locked Loop circuit comprising a MEMS variable capacitor and further comprising the charge pump circuit of claim 1.

11. A MEMS switch comprising the charge pump circuit of claim 1.

12. A method for increasing the operating range of an electrical circuit comprising:
    applying at least one low voltage signal to a first circuit, the first circuit generating an output voltage signal;
    applying a clock signal to a second circuit;
    communicating the output voltage signal to the second circuit;
    comparing the output voltage signal with two reference voltage signals in the second circuit, the two reference voltage signals being derived from two supply voltage signals;
    sending a request signal to a high voltage generator if the potential of the output voltage signal does not fall between the potentials of the reference voltage signals;
    sending the two supply voltage signals from the high voltage generator to the first circuit and the second circuit, the two supply voltage signals having a constant voltage difference; and
    adjusting the two supply voltage signals such that the output voltage signal falls between the two reference voltage signals.

13. The method of claim 12, wherein the first circuit and the second circuit operate in a high voltage power supply region and the high voltage generator operates in a low voltage power supply region.

14. The method of claim 13, further comprising converting signal levels of signals communicated between the high voltage power supply region and the low voltage power supply region.

* * * * *